US008803110B2

(12) United States Patent
Graf et al.

(10) Patent No.: US 8,803,110 B2
(45) Date of Patent: Aug. 12, 2014

(54) METHODS FOR BEAM CURRENT MODULATION BY ION SOURCE PARAMETER MODULATION

(75) Inventors: Michael A. Graf, Belmont, MA (US); Edward C. Eisner, Lexington, MA (US); William F. DiVergilio, Brookline, MA (US); Daniel R. Tieger, Manchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1515 days.

(21) Appl. No.: 11/541,087

(22) Filed: Sep. 29, 2006

(65) Prior Publication Data

US 2008/0078957 A1    Apr. 3, 2008

(51) Int. Cl.
*H01J 37/317*  (2006.01)
*H01L 21/265*  (2006.01)
*H01J 37/32*   (2006.01)

(52) U.S. Cl.
CPC ......... *H01J 37/3171* (2013.01); *H01J 37/3233* (2013.01); *H01J 37/32357* (2013.01); *H01J 37/32935* (2013.01); *H01J 2237/31701* (2013.01); *H01L 21/265* (2013.01)
USPC ................ 250/492.21; 250/427; 315/111.81; 315/111.91

(58) Field of Classification Search
None
See application file for complete search history.

(56) References Cited

U.S. PATENT DOCUMENTS

| 5,306,921 | A  | * | 4/1994  | Tanaka et al. ............ 250/492.21 |
| 5,661,308 | A  |   | 8/1997  | Benveniste et al. |
| 6,060,718 | A  | * | 5/2000  | Brailove et al. ............ 250/505.1 |
| 6,169,015 | B1 |   | 1/2001  | Fu-Kang |
| 6,452,338 | B1 |   | 9/2002  | Horsky |
| 6,661,016 | B2 | * | 12/2003 | Berrian .................... 250/492.21 |
| 6,686,595 | B2 | * | 2/2004  | Horsky ........................ 250/427 |
| 6,777,699 | B1 | * | 8/2004  | Miley et al. ................. 250/492.3 |
| 6,965,116 | B1 |   | 11/2005 | Wagner et al. |
| 7,022,999 | B2 |   | 4/2006  | Horsky et al. |
| 7,064,491 | B2 | * | 6/2006  | Horsky et al. ............ 315/111.81 |
| 2002/0053642 | A1 |  | 5/2002  | Berrian |
| 2004/0188631 | A1 |  | 9/2004  | Horsky et al. |
| 2005/0051096 | A1 |  | 3/2005  | Horsky et al. |
| 2005/0181584 | A1 |  | 8/2005  | Foad et al. |
| 2006/0272775 | A1 | * | 12/2006 | Horsky et al. ............ 156/345.37 |
| 2008/0067433 | A1 |  | 3/2008  | Weiguo et al. |
| 2008/0078955 | A1 |  | 4/2008  | Graf et al. |
| 2008/0078957 | A1 |  | 4/2008  | Graf et al. |
| 2008/0128621 | A1 |  | 6/2008  | Berry |

OTHER PUBLICATIONS

Office Action dated Jan. 2, 2009 in connection with U.S. Appl. No. 11/540,449.

* cited by examiner

*Primary Examiner* — Jack Berman
(74) *Attorney, Agent, or Firm* — Eschweiler & Associates, LLC (57) ABSTRACT

Beam current is adjusted during ion implantation by adjusting one or more parameters of an ion source. The ion beam is generated or provided by a non-arc discharge based ion source, such as an electron gun driven ion source or an RF driven ion source. A beam current adjustment amount is determined. Then, one or more parameters of the ion source are adjusted according to the determined beam current adjustment amount. The beam current is provided having a modulated beam current.

13 Claims, 8 Drawing Sheets

METHODS FOR BEAM CURRENT MODULATION BY ION SOURCE PARAMETER MODULATION

FIELD OF THE INVENTION

The present invention relates generally to ion implantation systems, and more specifically to improved systems and methods for adjusting dose during ion implantation.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

Ion beams employed in ion implantation systems typically have a smaller cross-sectional area than a substrate or wafer to be implanted. In order for the ion beam to completely cover the wafer, the ion beam and/or the wafer are moved relative to one another in order to scan the entire wafer surface. In one example, an ion beam is deflected so as to scan across a wafer, which is held in place. In another example, an ion beam remains fixed while a wafer is mechanically moved to allow the ion beam to scan across the wafer. In yet another example, the ion beam is scanned in a fast/horizontal direction while the wafer is mechanically moved in a slow/vertical direction.

Serial ion implantations generally operate on a single wafer at a time. Relative motion between an ion beam and wafer is effected, referred to as scanning, so that the ion beam traces a raster pattern on the wafer surface. Typically, there is an amount of overlap between adjacent scan lines to facilitate uniform implantation across the wafer/workpiece.

During ion implantation, variations in beam related characteristics, including pressure, contaminations, scanning, and the like can impact dosimetry and implantation uniformity. Relatively small changes (of 10% or less) in current can be helpful to compensate for these changes and can provide a more uniform implantation across a target workpiece.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention facilitate ion implantation by modulating beam current during ion implantation. The beam current is modulated by controllable and selectable amounts by adjusting one or more parameters of an ion source.

In accordance with one aspect of the invention, a method for operating an ion source is provided. An ion beam is generated or provided by a non-arc discharge based ion source, such as an electron gun driven ion source or an RF driven ion source. A beam current adjustment amount is determined. Then, one or more parameters of the ion source are adjusted according to the determined beam current adjustment amount. The beam current is provided having a modulated beam current. Other systems and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the drawings wherein like reference numerals are used to refer to like elements throughout, and wherein the illustrated structures are not necessarily drawn to scale.

Aspects of the present invention facilitate ion implantation by modulating beam current during ion implantation. The beam current is modulated by controllable and selectable amounts by adjusting one or more parameters of an ion source.

Figure 1A:
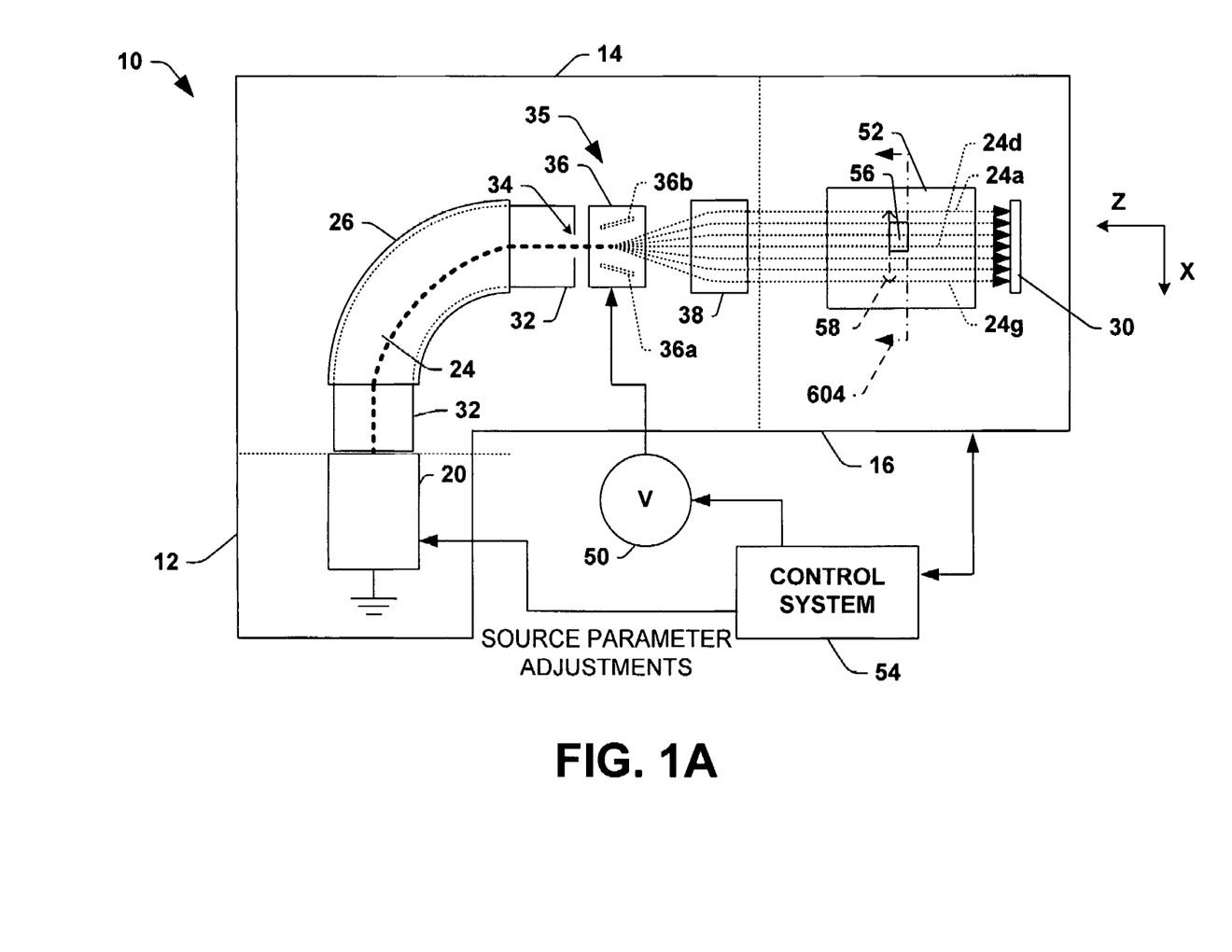
FIG. 1A is a diagram illustrating an exemplary ion implantation system with which one or more aspects of the invention can be employed.

FIG. 1A is a diagram illustrating an exemplary ion implantation system 10 having a terminal 12, a beamline assembly 14, and an end station 16 with which one or more aspects of the invention can be employed.

The terminal 12 includes an ion source 20 that produces and directs an ion beam 24 to the beamline assembly 14. The ion source 20 generates ions that are extracted from the source 20 and formed into the ion beam 24, which is directed along a beam path in the beamline assembly 14 to the end station 16.

The beamline assembly 14 has a beamguide 32, a mass analyzer 26 in which a dipole magnetic field is established to pass only ions of appropriate charge-to-mass ratio through a resolving aperture 34, a scanning system 35, and a parallelizer 38. The ion implantation system 10 may also include various beam forming and shaping structures extending between the ion source 20 and the end station 16, which maintain the ion beam 24 and bound an elongated interior cavity or passageway through which the beam 24 is transported to the workpiece 30 supported in the end station 16. This ion beam transport passageway is typically evacuated to reduce the probability of ions being deflected from the beam path through collisions with air molecules.

The implanter may employ different types of scanning systems that move the ion beam 24 relative to the target workpiece. For example, electrostatic systems, shown, couple a high-voltage power supply to scan plates. The voltage on the plates is adjusted to scan the beam. In magnetic systems, a high current supply is connected to the coils of an electromagnet. The magnetic field is adjusted to scan the beam. For purposes of this invention, all suitable types of scanning systems are equivalent and the electrostatic system is used for illustration.

The scanning system 35 includes a scanner 36 and a power supply 50 coupled to scanner plates or electrodes 36a and 36b, where the scanner 36 receives a mass analyzed ion beam 24 along the beam path from the mass analyzer 26 and provides a scanned beam 24 along the beam path to a parallelizer 38. The parallelizer 38 then directs the scanned beam 24 to the end station 16 such that the beam 24 strikes measurement sensor(s) of the dosimetry system 52 at a generally constant angle of incidence.

The scanner 36 receives a mass analyzed ion beam 24 having a relatively narrow profile (e.g., a "pencil" beam in the illustrated system 10), and a voltage waveform applied by the power supply 50 to the scanner plates 36a and 36b operates to scan the beam 24 back and forth in the X direction (the scan direction) to spread the beam 24 out into an elongated "ribbon" beam (e.g., a scanned beam 24), having an effective X direction width that may be at least as wide as or wider than the workpieces of interest. The scanned beam 24 is then passed through the parallelizer 38 that directs the beam toward the end station 16 generally parallel to the Z direction (e.g., generally perpendicular to the workpiece surface).

The implanter 10 may employ different types of end stations 16. For example, "batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The illustrated end station 16 is a "serial" type end station that supports a single workpiece 30 along the beam path for implantation (e.g., a semiconductor wafer, display panel, or other workpiece to be implanted with ions from the beam 24). A dosimetry system 52 can be situated near the workpiece location for calibration measurements prior to and during implantation operations. In one example, the dosimetry system 52 comprises one or more faraday cups that measure beam current or flux and are positioned downstream of the workpiece 30.

Figure 1B:
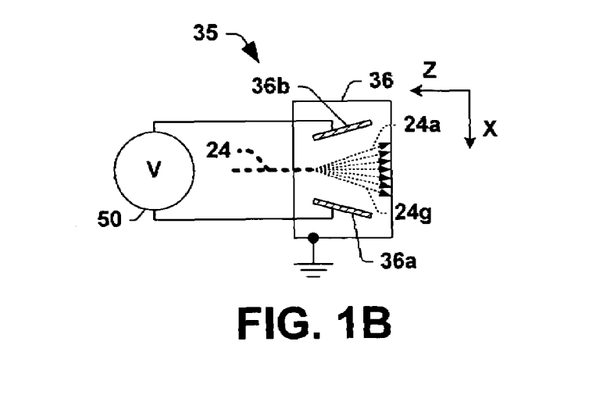
FIG. 1B is a diagram illustrating a scanner and several scanned ion beams.
Figure 1C:
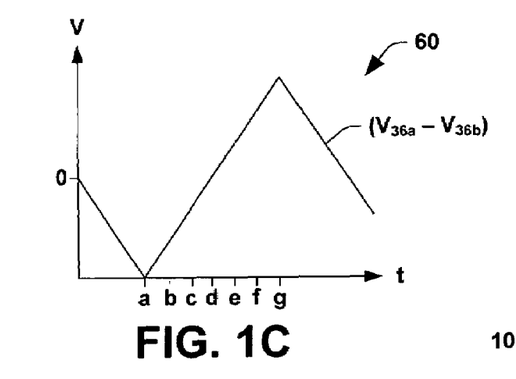
FIG. 1C is an example of a triangular scanning plate voltage waveform in the scanner of FIGS. 1A and/or 1B.

The electrostatic version of the beam scanner 36 is further illustrated in FIG. 1B, having a pair of scan plates or electrodes 36a and 36b on either lateral side of the beam path, and a voltage source 50 that provides alternating voltages to the electrodes 36a and 36b, as illustrated in a waveform diagram 60 in FIG. 1C. The time-varying voltage between the scan electrodes 36a and 36b creates a time varying electric field across the beam path therebetween, by which the beam 24 is bent or deflected (e.g., scanned) along a scan direction (e.g., the X direction in FIGS. 1A, 1B, and 2B-2F). When the scanner electric field is in the direction from the electrode 36a to the electrode 36b (e.g., the potential of electrode 36a is more positive than the potential of electrode 36b, such as at times "e" and "g" in FIG. 1C), the positively charged ions of the beam 24 are subjected to a lateral force in the negative X direction (e.g., toward the electrode 36b). When the electrodes 36a and 36b are at the same potential (e.g., zero electric field in the scanner 36, such as at time "d" in FIG. 1C), the beam 24 passes through the scanner 36 unmodified. When the field is in the direction from the electrode 36b to the electrode 36a (e.g., times "a" and "c" in FIG. 1C), the positively charged ions of the beam 24 are subjected to a lateral force in the positive X direction (e.g., toward the electrode 36a).

The control system 54 receives and monitors dosimetry information from the dosimetry system 52 during ion beam operation. The dosimetry information includes, for example, beam current, current density, and flux.

Additionally, the control system 54 interacts with the ion source 20 to make adjustments to the current. The adjustments are relatively small, such as less than about 10 percent, and can be in response to dosimetry information or for other purposes. For example, a temporary slowdown in scanning speed can be compensated by lowering the current accordingly. Similarly, a temporary increase in scanning speed can be compensated by increasing the current accordingly. In order to permit such modulation in current, the ion source 20 is set to a normal output level at about 90 percent or less of maximum capacity. This allows for suitable increases, as well as decreases, in beam current.

In order to modulate the beam current of the ion source 20, the control system 54 adjusts one or more parameters of the ion source 20. The parameters modulated depend on the type of ion source 20 employed. For example, beam current generated by an electron gun can be modulated by adjusting electron beam energy, electron beam current, extraction plate bias voltage, and the like. Some examples of parameters that modulate beam current for RF driven ion sources include, for example, RF input power, extraction electric field, and the like. Some examples of parameters that can be modulated and mechanisms of doing so are provided infra for both electron gun and RF driven ion sources.

Figure 1D:
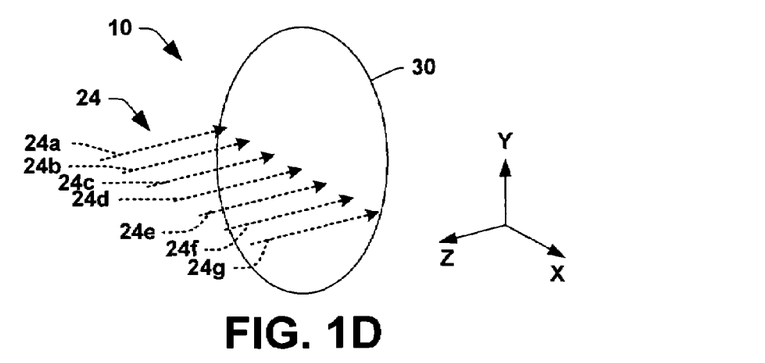
FIG. 1D is a perspective view illustrating one scanned ion beam striking a workpiece in the system of FIG. 1A at several discrete points in time.

FIG. 1B is a diagram that shows the scanned beam 24 deflection as it passes through the scanner 36 at several discrete points in time during scanning prior to entering the parallelizer 38. FIG. 1D illustrates the scanned and parallelized beam 24 impacting the workpiece 30 at the corresponding times indicated in FIG. 1C. The scanned and parallelized ion beam 24a in FIG. 1D corresponds to the applied electrode voltages at the time "a" in FIG. 1C, and subsequently, the beam 24b-24g is illustrated in FIG. 1D for scan voltages at corresponding times "b"-"g" of FIG. 1C for a single generally horizontal scan across the workpiece 30 in the X direction.

Figure 2:
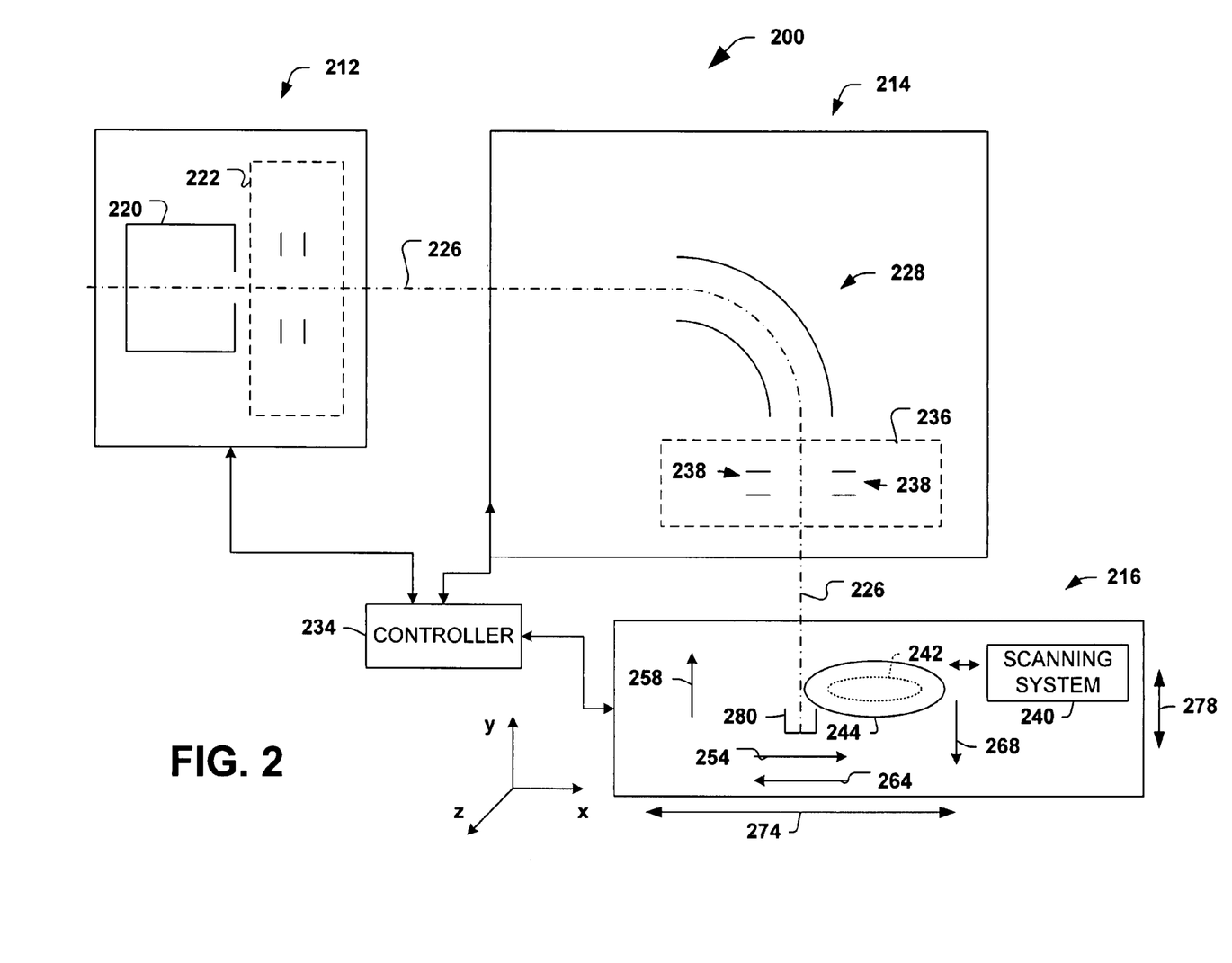
FIG. 2 illustrates another exemplary ion implantation system suitable for implementing one or more aspects of the present invention.

FIG. 2 illustrates another exemplary ion implantation system 200 suitable for implementing one or more aspects of the present invention. The system 200 is also provided as an example for illustrative purposes. The system 200 employs a fixed beamline and a two dimensional wafer scanning motion of the workpiece 244.

The implantation system 200 includes a terminal 212, a beamline assembly 214, and a target or end station 216. The terminal 212 produces and directs an ion beam 226 to the beamline assembly 214. The terminal 212 includes a source 220 that generates ions that are extracted by extraction electrodes 222 and formed into the ion beam 226 and directed along a beam path in the beamline assembly 214 to the end station 216.

Within the beamline assembly 214, a mass analyzer 228 performs mass analysis on the ion beam 226 to remove non selected ions according to a selected charge-to-mass ratio. As the beam 226 enters the mass analyzer 228, it is correspondingly bent by a magnetic field such that ions of an inappropriate charge-to-mass ratio are rejected. Control electronics or a controller 234 can be included to adjust the strength and orientation of the magnetic field, among other things. The magnetic field can, for example, be controlled by regulating the amount of electrical current running through field windings of the magnet 228. It will be appreciated that the controller 234 may include a programmable micro-controller, processor and/or other type of computing mechanism for overall control of the system 200 (e.g., by an operator, previously and/or presently acquired data and/or programs).

The beamline assembly 214 may also include an accelerator 236, for example, that comprises a plurality of electrodes 238 arranged and biased to accelerate and/or decelerate ions, as well as to focus, bend and/or decontaminate the ion beam 226. Further, it will be appreciated that ion beam collisions with other particles degrade beam integrity so that the entire beamline assembly 214 from the source 212 to the end station 216, including the mass analysis magnet 228, may be evacuated by one or more pumps (not shown). Downstream of the accelerator 236 is the end station 216 which receives the mass analyzed ion beam 226 from the beamline assembly 214. The end station 216 includes a two dimensional scanning system 240 that may comprise a support or end effector 242 upon which a workpiece 244 to be treated is mounted for selective movement thereby. The end effector 242 and workpiece 244 reside in a target plane that is generally perpendicular to the direction of the ion beam 226.

The workpiece 244 is moved (e.g., via the end effector 242) back and forth in directions 254, 264 along a first or "fast" scan path 274 (e.g., along the x-axis) and is also moved through slow scan directions 258 or 268 along a second or "slow" scan path 278 (e.g., along the y-axis) as the workpiece 244 oscillates along the first scan path 274. In this manner, a scan pattern produced thereby covers or approximates the shape of the workpiece 244. By way of example, in the system 200 illustrated in FIG. 2, the workpiece 244 has just completed a fast scan in direction 254, and is thus ready to be moved back through fast scan direction 264 (e.g., once the workpiece 244 has been indexed along the slow scan path 278).

The respective ranges of motion of the workpiece 244 along the first scan path 274 may be a function of the orientation of the workpiece 244 relative to the ion beam 226 as well as the size, shape and/or other dimensional data of the workpiece 244 and/or the ion beam, for example. The controller 234 may, for example, utilize such orientation data and dimensional data to control the selective movement of the workpiece 244. For example, the respective ranges of motion of the workpiece 244 along the fast scan path 274 may be controlled (e.g., by the controller 234) to slightly exceed the respective sizes of the portions of the workpiece 244 being scanned during the respective oscillations so that the workpiece 244 is not impinged upon by the ion beam while the workpiece is changing directions and/or moving along the second scan path 278. In this manner, respective overshoots can be said to exist for the different oscillations. Such overshoots can, for example, be made large enough to accommodate inertial effects that are inevitable when the workpiece 244 changes direction and/or velocity.

A measurement component 280 (e.g., a Faraday cup) may also be incorporated into the end station 216. The measurement component 280 may be operative to detect beam current, for example, and may be situated behind the workpiece 244 (e.g., so as to not interfere with the ion implantation process). A detected level of beam current can, for example, be utilized to identify the end of a scan.

Additionally, the controller 234 interacts with the ion source 220 to make adjustments to the dose. The adjustments are relatively small, such as less than about 10 percent, and can be in response to dosimetry information or for other purposes. For example, a temporary slowdown in scanning speed can be compensated by lowering the dose accordingly. Similarly, a temporary increase in scanning speed can be compensated by increasing the dose accordingly. In order to permit such modulation in dose/current, the ion source 220 is set to a normal output level at about 90 percent or less of maximum capacity. This allows for suitable increases, as well as decreases, in dose rate generated by the ion source 220.

In order to modulate the beam current of the ion source 220, the control system 234 adjusts one or more parameters of the ion source 220. The parameters modulated depend on the type of ion source 220 employed. For example, beam current generated by an electron gun can be modulated by adjusting electron beam energy, electron beam current, extraction plate bias voltage, and the like. Some examples of parameters that modulate beam current for RF driven ion sources include, for example, RF input power, extraction electric field, and the like. Some examples of parameters that can be modulated and mechanisms of doing so are provided infra for both electron gun and RF driven ion sources.

The system 200 is provided as an example of an ion implantation system and it is appreciated that the present invention contemplates other suitable ion implantation systems and variations thereof.

One example of a two dimensional scanning ion implantation system is described in Graf et al., U.S. Pat. No. 6,953,942, filed Sep. 20, 2004 and entitled ION BEAM UTILIZATION DURING SCANNED ION IMPLANTATION, which is hereby incorporated by reference in its entirety.

Figure 3A:
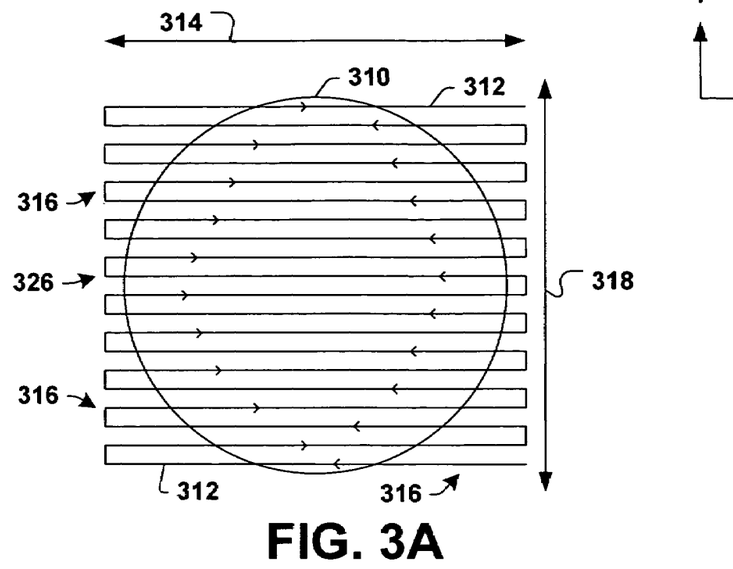
FIG. 3A is a diagram illustrating another example scan of an ion beam across a workpiece.

FIG. 3A is a diagram illustrating another example scan 312 of an ion beam across a workpiece 310. The scan 312 can be generated, for example, by the ion implantation system 10 described in FIG. 1 above having a scanned ion beam and one dimensional movement of the workpiece 310.

The scan pattern 312 is created by scanning an ion beam back and forth along a first or "fast" scan path 314, where the fast scan path 314 corresponds to a widest portion 326 of the workpiece 310 plus some overshoot 316. The overshoot 316, in turn, corresponds to instances where the beam is scanned past the workpiece 310 and therefore no longer impinges on the workpiece 310. The beam is also moved along a second or "slow" scan path 318 as the beam oscillates along the first scan path 314. It can be appreciated that the scan pattern 312 is basically independent of the size and/or shape of the workpiece 310 in that only the widest portion 326 of the workpiece 10 is considered so that the scan pattern 312 is large enough to cover this widest portion 326 of the workpiece 310.

Figure 3B:
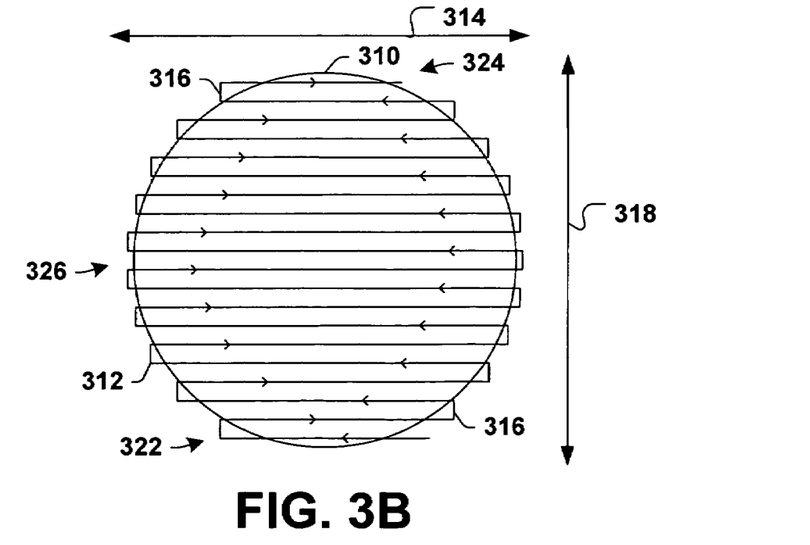
FIG. 3B is a diagram illustrating yet another example scan of an ion beam across a workpiece.

FIG. 3B is a diagram illustrating yet another example scan of an ion beam across a workpiece 310. The scan 312 can be generated, for example, by the ion implantation system 200 described in FIG. 2 having a 2-D movement of the workpiece 310. A scan pattern 312 shown here resembles the size and/or shape of the workpiece 310. More particularly, the workpiece 310 is controllably moved through respective ranges of motion along a first or fast scan path 314, where the ranges of motion correspond to respective sizes of the workpiece 310 being scanned during respective oscillations along the first scan path 314. In the illustrated example, the workpiece is also indexed one increment along a second or slow scan path 318 between respective oscillations along the first scan path 314. As such, overshoot 316 can be reduced.

Figure 4:
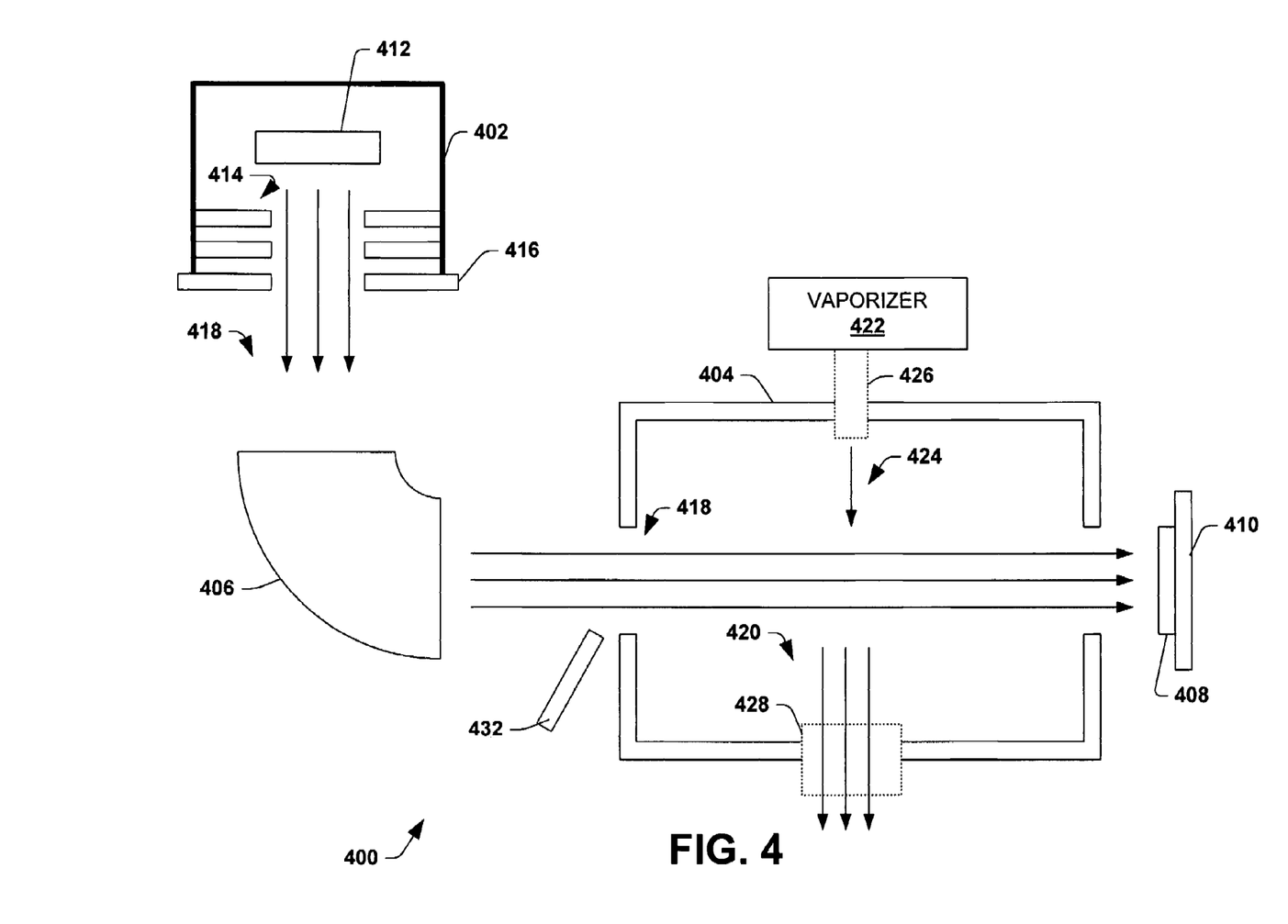
FIG. 4 is a diagram illustrating an electron gun based ion implantation system in accordance with an aspect of the present invention.

FIG. 4 is a diagram illustrating an electron gun based ion source system 400 in accordance with an aspect of the present invention. The system 400 is provided as an example of a non-arc discharge based ion source system.

The system 400 includes an electron gun 402, an ionization chamber 404, a bending magnet 406, a beam dump 408, and a vaporizer 422. The electron gun 402 generates a directed steam of energetic electrons as an electron beam 418. The bending magnet 406 alters a path of the electron beam 418 toward the entrance aperture of the ionization chamber 404. The vaporizer 422 provides a source material, such as a vapor or gas, to the ionization chamber 404. The electrons 418 impact the source material and ionize materials within the gases to form a plasma from which an ion beam 420 can be extracted there from. The electron beam 418 exits the chamber 404 via an exit aperture and impacts the beam dump 408. The ion beam 420 is extracted from the ionization chamber 404 via an ion exit aperture. Additionally, an electron dump 432 is shown to catch/absorb particles that do not pass into the ionization chamber 404. It is appreciated that alternate aspects of the invention can omit the electron dump 432.

The electron gun 402 comprises a cathode 412, and electron optics 414, and a source shield 416. An anode 410 is positioned about the beam dump 408. The cathode 412 is maintained at an electrical potential below the ionization chamber 404 and generates the electron beam 418. The electron optics 414 can focus and form the electron beam to a selected size and shape, such as a relatively wide ribbon beam. The electron optics 414 operate by selectively applying voltages such that the selected size and shape is obtained. The source shield 416 mitigates heat load to the ionization chamber 404 and, in one example, is comprised of a water-cooled sheet metal assembly.

The vaporizer 422 vaporizes solid materials that have relatively high vapor pressures at moderate temperatures, such as about 100 C. The vaporizer 422 provides the gas to the ionization chamber 404 at a flow rate dependent upon vaporizer 422 temperature. Gas feed lines 426 can be employed to transport the gas from the vaporizer 422 to the ionization chamber 404, however other transport mechanisms can be employed. It is also possible to operate the source without using a vaporizer and instead using gaseous feed material directly.

The ionization chamber 404 is where the gas(es) are fed and ionized by electron impact. A plasma is generated within the ionization chamber 404 as a result of the impact of the gas and electrons. In one example, the ionization chamber 404 is rectangular shaped and comprised of a machined material, such as aluminum or graphite. The chamber 404 includes the entrance aperture near the electron gun 402 that receives the electron beam 418 and the electron exit aperture on an opposite end and downstream of the entrance aperture. The ion exit aperture 428 provides the ion beam 420. The flow rate of the gas into the ionization chamber 404 is provided at a sufficient level to maintain proper feed gas pressure within the chamber 404.

A control system (not shown) is connected to the system 400 and can adjust one or more ion source parameters in order to modulate the beam current of the ion beam 420. The control system determines or selects when adjustments are needed and how much adjustment should be made to the beam current of the ion beam 420. Generally, this is accomplished by altering the electron beam 418 and/or properties of the source material 424. Decreasing the current of the electron beam 418 tends to decrease beam current of the ion beam 420 and increasing the current of the electron beam 418 tends to increase beam current of the ion beam 420. A similar impact on the beam current of the ion beam 420 can be made by altering properties of the source material 424, such as altering the flow rate, altering the composition, and the like.

One mechanism that can be employed to alter beam current of the ion beam 420 is to apply a programming voltage to the cathode 412 in order to alter cathode current and, in turn, increase or decrease electron generation. As a result, the current of the electron beam 418 is altered and less or more ionization of the vapor or gas 424 occurs, which results in an altered current for the ion beam 420. Additionally, the path of the electron beam 418 can be altered causing less or more electrons to pass through the magnet 406 and into the ionization chamber 404. Furthermore, the program voltage can alter the position of the electron beam 418 within the ionization chamber 404, thereby altering ionization.

Another mechanism that can be employed to alter beam current is to apply a program or adjustment voltage to the electron beam forming optics 414. The program voltage is varied from a typical or normal voltage applied. As a result, the size and shape of the electron beam 418 generated is altered. In one example, the shape is widened such that a portion of the electron beam is blocked at the entrance of the ionization chamber. An another example, the shape and/or size of the electron beam 418 is altered such that the current of the electron beam 418 is altered as it passes through the magnet 406.

Yet another mechanism that can be employed to alter the beam current is to apply a selected voltage or program voltage to the exit aperture 428. The voltage applied to the exit aperture 428 induces positively charged ions or dopants to exit the ionization chamber 404. Applying a selected voltage to the exit aperture 428 can, as a result, increase or decrease beam current of the generated ion beam 420.

Another mechanism that can be employed is to employ a programming voltage to the anode 410. This can impact the electron beam 418 and ionization similar to applying a program voltage to the cathode 412.

Yet another mechanism is to alter the magnetic field generated by the bending magnet 406. For permanent magnets, this requires changing the reluctance of the magnetic circuit by, for example, moving an iron shunt near the magnet. For electromagnets, a field generating current is altered. The altered magnetic field changes the position of the electron beam 418 within the ionization chamber. As a result, ionization of the source material 424 is altered, which modifies beam current of the ion beam 420.

Another mechanism that can be employed is changing the strength of a magnetic field aligned with the electron beam 418 in the source (e.g., a source magnet) to modify the beam current. For permanent magnets, the field strength can be adjusted by changing the reluctance of the permanent magnet circuit by moving either the magnets or shunts. For electromagnets, the energizing current can be varied.

It is appreciated that other suitable mechanism can be employed to adjust parameters of electron gun driven ion sources in this and alternate aspects of the invention. Furthermore, it is appreciated that more than one of the above mechanisms can be employed at a time. For example, the programming voltage can be applied to the cathode 412 and, at the same time, the magnetic field of the bending magnet 406 can be altered.

An example of a suitable electron gun ion source, which can be employed with the present invention, is described in Horsky, U.S. Pat. No. 6,452,338, granted Sep. 17, 2002, which is hereby incorporated by reference in its entirety.

Figure 5:
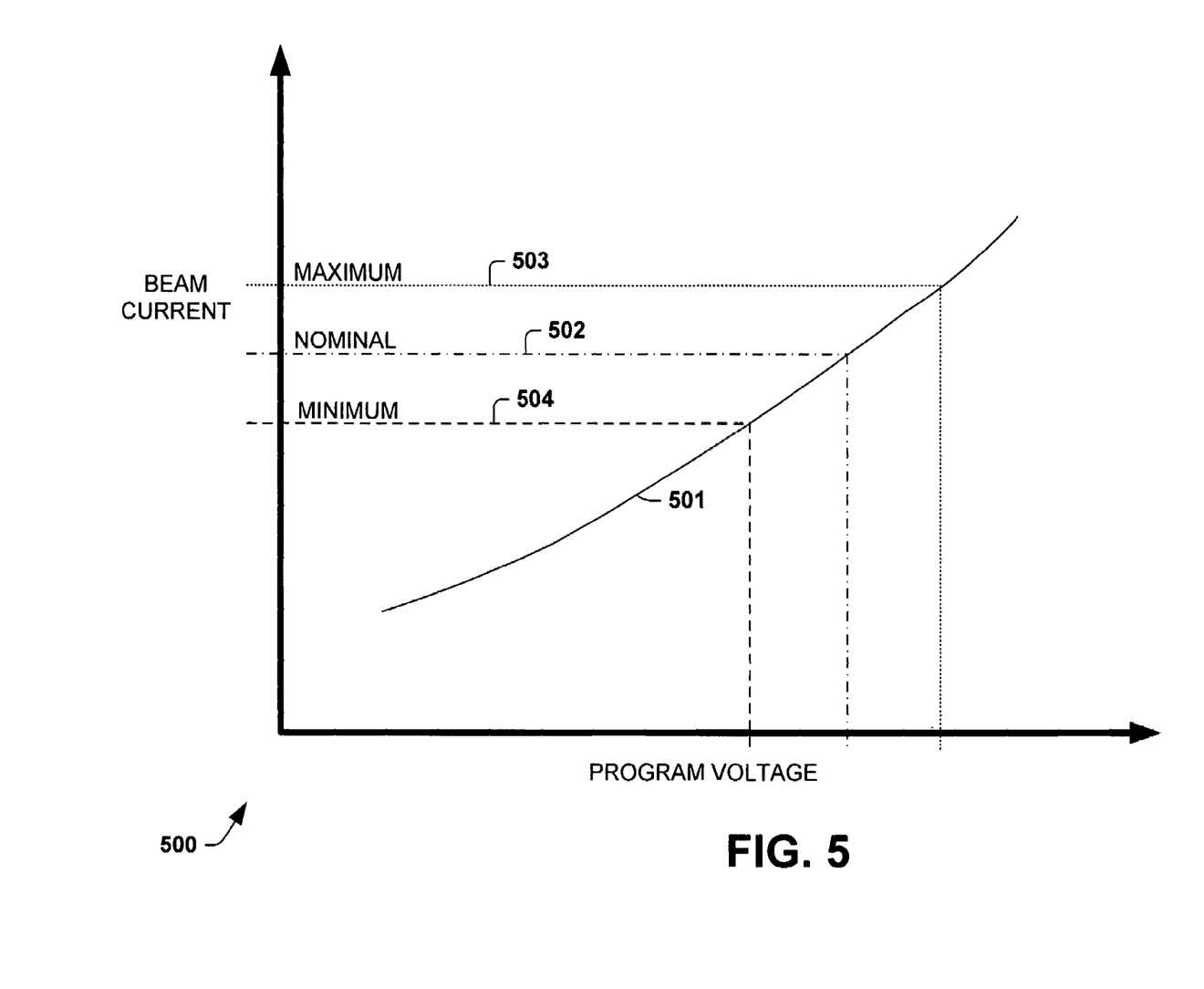
FIG. 5 is a graph illustrating an example relationship between program voltage and beam current in accordance with an aspect of the present invention.

FIG. 5 is a graph 500 illustrating an example relationship between program voltage and beam current in accordance with an aspect of the present invention. The graph 500 is provided for illustrative purposes and does not depict actual or experimental values.

The graph 500 simulates a relationship of a program voltage applied to a cathode of an electron gun driven ion source, such as the source 400 described above with respect to FIG. 4. The program voltage is shown along an x-axis and the beam current of a generated ion beam is shown along a y-axis. The program voltage alters the current of an electron beam and/or alters the position of the electron beam with respect to an ionization chamber. As a result, ionization of a source material, such as a vapor or gas, within the ionization chamber can be increased or decreased. Alteration of the ionization modulates the beam current of the generated ion beam. Thus, the program voltage applied to the cathode can alter beam current of the generated ion beam.

A line 501 demonstrates a possible relationship between the program voltage and the beam current. In this example, increasing the program voltage increases the beam current. A nominal voltage yields a normal or typical beam current as shown at 502. An increased or maximum current is shown at 503, and indicates an increased beam current in response to an increased program voltage. Similarly, a minimum current is shown at 504, which indicates a decreased beam current in response to a decreased program voltage.

Figure 6:
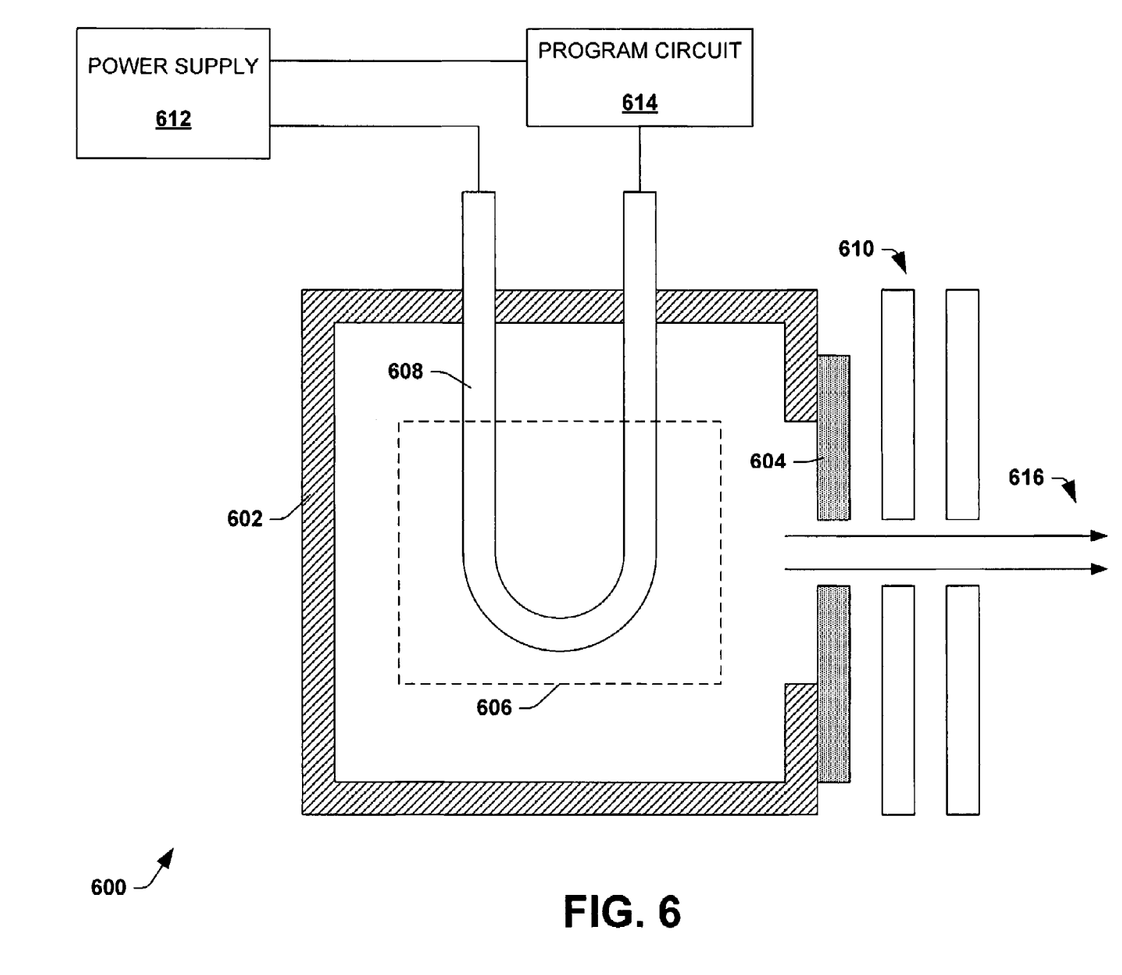
FIG. 6 is a diagram illustrating an RF driven ion source in accordance with an aspect of the present invention.

FIG. 6 is a diagram illustrating an RF driven ion source 600 in accordance with an aspect of the present invention. The ion source 600 is configured so that one or more parameters can be adjusted in order to modulate generated beam current.

The ion source 600 includes a plasma chamber 602 that defines an ionization zone 606. The plasma chamber 602 typically has conductive walls that bound the ionization zone 606. An aperture plate 604 is positioned along one of the walls of the plasma chamber 602. The aperture plate 604 selectively allows ions to pass through an opening/aperture therein. Suppression/extraction electrodes 610 are positioned downstream of the aperture plate 604 and form the ions into an ion beam 616.

Source materials are contained within the ionization zone 606, for example, in a form of a gas or vaporized source material. The source material is routed into the ionization zone 606 from a source external to the chamber 602. A metallic antenna 608 is positioned within the chamber 602 and has leads or portions outside the chamber 602. The metallic antenna 608 emits energy into the ionization zone 606 to encourage or enable ionization of the source materials therein. A power supply 612 is connected to the antenna 608 via a program voltage circuit 614. The power supply 612 provides the energy/power to the metallic antenna 608 to encourage the ionization. The circuit 614 and/or the power supply 612 can alter the power or energy supplied to the antenna 608 in order to modulate beam current.

During operation, the source materials are ionized by energy from the antenna 608 within the ionization zone 606. The ions can only exit the chamber 602 via the aperture of the aperture plate 604. The suppression electrodes 610 are biased with selected values and form the exited ions into the ion beam 616.

A control system (not shown) can modulate beam current of the ion beam 616 via a number of suitable techniques. Some examples of parameters that modulate beam current for RF driven ion sources include, for example, RF input power, extraction electric field, and the like.

The RF input power provided by the power supply 612 to the antenna 608 can be altered to vary ionization produced by the antenna 608 within the ionization zone 606. The varied ionization results in a modulated beam current. Thus, applying a program voltage to the antenna 608 by adjusting the power supply 612 and/or the circuit 614 modulates the beam current for the generated ion beam 616.

The extraction electrodes 610 can have a program voltage applied thereto in order to alter characteristics of the ion beam 616. For example, the voltage applied thereto can result in a shape wherein a portion of the beam 616 gets blocked during transport, which reduces beam current of the ion beam 616.

In another example, the flow rate of the gas into the ionization zone 606 can be altered. A lower flow rate yields less material that can be ionized and, as a result, yields reduced ionization. Similarly, a higher flow rate yields more ionizable material and leads to increased ionization. The altered rate of ionization leads to a modulated beam current for the ion beam 616. Thus, modulating the flow rate of gas into the ionization zone 606 can be employed to modulate the beam current. A control system (not shown) can be employed to select and initiate the variations in flow rate in order to yield a selected beam current.

It is appreciated that other mechanisms in addition to those described above can be employed to adjust parameters of RF driven ion sources to adjust beam current. Additionally, it is also appreciated that more than one of the parameters can be adjusted to yield a selected beam current.

Figure 7:
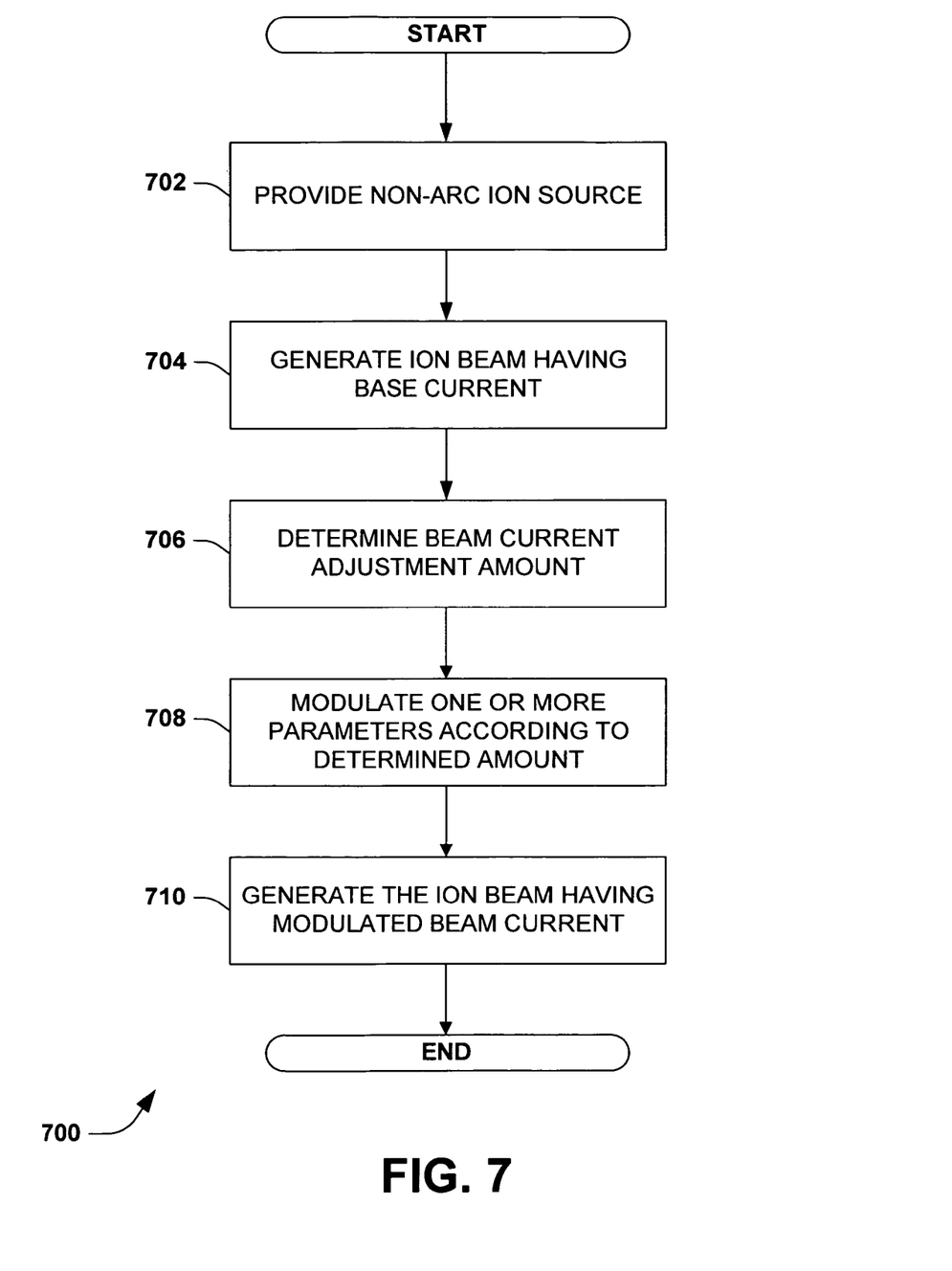
FIG. 7 is a flow diagram illustrating a method of operating an ion source of an implantation system in accordance with an aspect of the present invention.

FIG. 7 is a flow diagram illustrating a method 700 of operating an ion source of an implantation system in accordance with an aspect of the present invention. The method 700 performs relatively small adjustments, such as about 10 percent, in beam current by adjusting one or more parameters of an ion source.

The method 700 begins at block 702 wherein an ion source is provided. The ion source is typically a non-arc discharge ion source, such as an RF driven ion source or an electron gun driven ion source. The ion source has one or more tunable parameters that can be adjusted in order to modulate beam current. For example, beam current generated by an electron gun driven ion source can be modulated by adjusting parameters such as electron beam energy, electron beam current, extraction plate bias voltage, and the like. Some examples of parameters that modulate beam current for RF driven ion sources include, for example, RF input power, extraction electric field, and the like.

The ion source generates an ion beam having a nominal or base beam current at block 704. Generally, the nominal or base current value is somewhat below a maximum producible current for the ion source. This permits increases and/or decreases in beam current to be made.

An amount of beam current adjustment is determined at block 706. The adjustment can be dependent upon a number of factors including, but not limited to, scanning rates, pressure variations, energy contaminants, and the like. Additionally, dosimetry measuring devices, such as faraday cups, return current monitors, and the like can be employed to obtain measured beam current and facilitate determining the adjustment of beam current.

One or more parameters of the ion source are adjusted at block 708 according to the adjustment amount. Relationships between the one or more parameters and the beam current can be established by, for example, developing formulas, experimental data, and the like. Once established, the relationship can be employed to determine adjustments for the one or more parameters. For example, the graph 500 of FIG. 5 demonstrates a possible relationship between a programming voltage and beam current. The adjustment amount can be employed to find an appropriate programming voltage that yields the desired or selected adjustment, in this example. A control system and/or other mechanism can be employed to implement or enable the adjustment of the one or more parameters.

Subsequently, the ion source generates the ion beam according to the adjustment amount at block 710. Beam current measurements, such as faraday cups and return current monitors can be employed to verify the adjustments. The method 700 can be repeated or enabled dynamically during ion implantation.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method of operating an ion source of an ion implantation system, the method comprising:
providing an ion beam by a non-arc discharge ion source, wherein the non-arc discharge ion source comprises an electron gun driven ion source, comprising:
an electron gun source comprising a cathode and electron optics, wherein the electron gun source is configured to generate an electron beam having a first shape traveling in a first direction;
a bending magnet downstream of the electron gun source and configured to bend the electron beam from the first direction to a second, different direction;
an ionization chamber downstream of the bending magnet, and comprising a source material inlet, an electron beam exit aperture, and an ion beam exit aperture, wherein the ionization chamber is configured to receive a source gas via the source material inlet, and generate ions via collisions between the electron beam and the source gas, and further configured to generate the ion beam at the ion beam exit aperture via an extraction voltage thereat;
determining a beam current adjustment amount;
modulating one or more parameters of the ion source according to the determined beam current adjustment amount; and
providing the ion beam having a modulated beam current.

2. The method of claim 1, wherein determining the beam current adjustment amount comprises measuring beam current proximate to an end station downstream of the non-arc discharge ion source.

3. The method of claim 1, wherein determining the beam current adjustment amount comprises monitoring scanning rates by a scanner.

4. The method of claim 1, further comprising determining a functional relationship between beam current of the ion beam and the one or more parameters.

5. The method of claim 1, wherein modulating the one or more parameters comprises adjusting an electron beam energy of the electron gun driven ion source.

6. The method of claim 1, wherein modulating the one or more parameters comprises applying a program voltage to the cathode of the electron gun of the electron gun driven ion source.

7. The method of claim 1, wherein modulating the one or more parameters comprises adjusting a flow rate of a source material into the ionization chamber of the electron gun driven ion source.

8. The method of claim 1, wherein modulating one or more parameters comprises altering a flow rate of a source gas to the ionization chamber as a function of the determined beam current adjustment amount.

9. The method of claim 1, wherein modulating one or more parameters comprises altering a composition of a source gas to the ionization chamber as a function of the determined beam current adjustment amount.

10. The method of claim 1, wherein modulating one or more parameters comprises altering an extraction voltage at the ion beam exit aperture as a function of the determined beam current adjustment amount.

11. The method of claim 1, wherein modulating one or more parameters comprises altering a shape of the electron beam via the electron optics in the electron gun source as a function of the determined beam current adjustment amount.

12. The method of claim 1, wherein modulating one or more parameters comprises altering a magnetic field of the bending magnet to alter a direction of the electron beam into the ionization chamber as a function of the determined beam current adjustment amount.

13. The method of claim 1, wherein the electron gun source further comprises an anode and beam dump assembly at the electron beam exit aperture of the ionization chamber, and wherein modulating one or more parameters comprises altering a potential of the anode as a function of the determined beam current adjustment amount.

* * * * *